United States Patent

Smith

(10) Patent No.: US 6,690,152 B2
(45) Date of Patent: Feb. 10, 2004

(54) ACCELERATION OF AUTOMATIC TEST

(75) Inventor: David Smith, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/917,282

(22) Filed: Jul. 27, 2001

(65) Prior Publication Data

US 2003/0020449 A1 Jan. 30, 2003

(51) Int. Cl.[7] .............................................. G01R 22/00
(52) U.S. Cl. .................................. 324/76.17; 324/76.17
(58) Field of Search ........................ 324/76.17; 396/129

(56) References Cited

U.S. PATENT DOCUMENTS

| | | | | |
|---|---|---|---|---|
| 4,538,262 A | * | 8/1985 | Sinniger et al. | 307/10.1 |
| 4,940,909 A | * | 7/1990 | Mulder et al. | 326/38 |
| 5,272,729 A | * | 12/1993 | Bechade et al. | 327/141 |
| 5,721,933 A | * | 2/1998 | Walsh et al. | 307/31 |
| 5,936,442 A | * | 8/1999 | Liu et al. | 327/142 |

* cited by examiner

Primary Examiner—N. Le
Assistant Examiner—John Teresinski

(74) Attorney, Agent, or Firm—Wolf, Greenfield & Sacks, P.C.; James H. Morris; William R. McClellan

(57) ABSTRACT

Integrated circuitry including a clock circuit powered by a first power supply and a secondary circuit powered by a second power supply. The secondary circuit includes a control signal output for supplying a control signal to the clock circuit and a clock data output for outputting new clock data to the clock circuit. The clock circuit includes: clock generator means for generating current clock data and outputting it to the secondary circuit; detector means for monitoring voltage from the second power supply and generating a system reset signal for supply to the secondary circuit in the event the voltage falls below a predetermined level; a first latch having a reset operable by a predetermined state of the system reset output generated by the detector means; a comparator accepting as inputs the control signal from the secondary circuit and an output of the first latch; and a multiplexor accepting as data inputs the clock data from the secondary circuit and the clock data from the clock circuit, and accepting as a control input the output of the comparator. The integrated circuitry is configured such that when the secondary circuit is not asserted and the control signal is asserted, the current clock data in the clock circuit is replaced with the new clock data. Moreover, when the first latch is reset, the comparator and multiplexor prevent current clock data from being replaced by data from the secondary circuit.

16 Claims, 1 Drawing Sheet

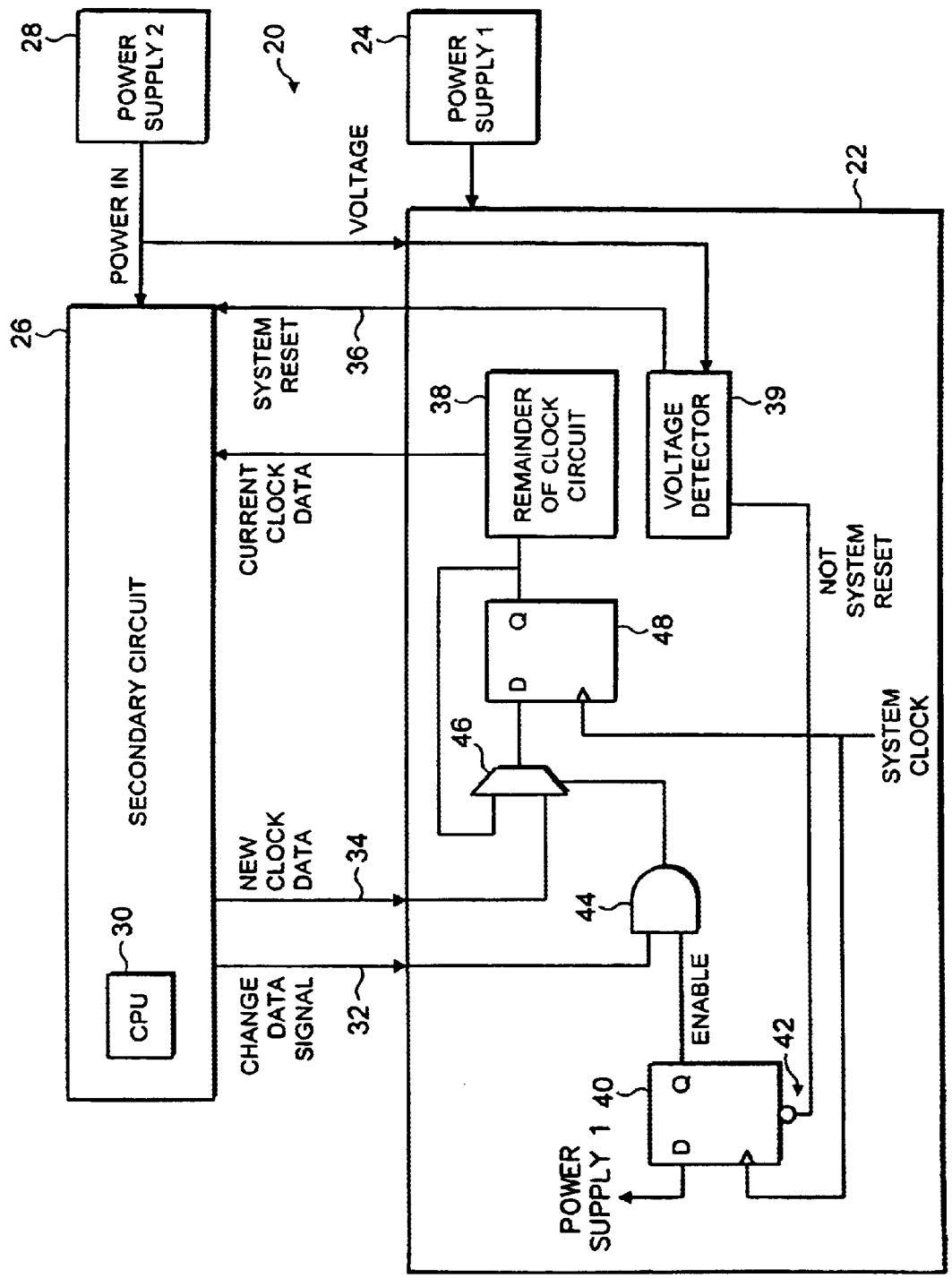

ACCELERATION OF AUTOMATIC TEST

FIELD OF INVENTION

The present invention relates to the field of integrated circuitry, and, more particularly, to integrated circuits including a clock circuit connected to a secondary circuit, the two circuits being in respectively different power supply domains.

The integrated circuit of the invention has been specifically been designed for use in situations where a first battery powers the clock Circuit and a second battery powers the secondary circuit, and will be described hereinafter with reference to this specific embodiment. However, it will be appreciated that the invention may be applied to a number of different scenarios.

BACKGROUND

It is often desirable to power a clock circuit independently of another secondary circuit. A typical example is a camera, where the main battery that powers the shutter release and wind-on motor for film drains quickly and needs to be replaced relatively often. To prevent loss of clock and other data settings when the main battery goes flat, it is customary to provide a clock battery that powers only the clock part of the circuitry. Given that most modern clock circuits are of CMOS construction, they tend to be relatively energy efficient, and can run for long periods of time powered only by a small battery such as a "button" type battery. An example of this split power domain arrangement is illustrated in FIG. 1.

Whilst this arrangement is useful when the device is in operation, it raises some difficulties due to the behaviour of the circuitry when the main battery fails. For example, it is usual to configure devices such that the clock data maintained by the clock circuitry can be amended or updated via other circuitry powered by the main battery. Unfortunately, the control paths used to effect is can be the cause of spurious signals as the main battery fails, which in certain combinations at particular times can cause the clock data to inadvertently be changed.

Typically, during operation, the power supply to the secondary circuit is monitored, and whenever it drops outside of an acceptable range, a reset signal is given to the device. This reset signal causes all flip-flops within the device (ie, excluding the clock circuit) to be reset. Since this signal is always active whenever the main chip is powered down, it can be used by the clock circuit to determine whether control signals attempting to change the clock data within the clock circuit are valid. One way of using the reset signal is to include a comparator that prevents updating of the clock data when the secondary circuit is powered down.

Unfortunately, the introduction of such a component can reduce testability, or at least speed of testing, of the circuitry during manufacture. During such testing, Automatic Test Pattern Generation (ATPG) creates patterns of stimuli that are applied to the circuit to ensure that every single gate and wire is tested. However, some signals are considered special in the ATPG process, clock and system reset being examples.

Because the reset signal is used as a reset for the rest of the chip, the circuitry that implements the corruption protection cannot be tested at the same time as the rest of the chip, because the ATPG process requires the value of the signal to change. This will cause major problem with the rest of the chip, as any test pattern will be overridden by the reset signal. This means that the clock corruption protection circuitry must be tested on its own rather than in parallel with the rest of the chip, thereby lengthening the total time taken to test a device.

It is an object of the invention to provide circuitry that prevents spurious signals from inappropriately amending real-time clock data within a clock circuit as a connected circuit is powered down or reset, whilst improving testability over prior art arrangements.

SUMMARY OF INVENTION

The present invention provides integrated circuitry including a clock circuit powered by a first power supply and a secondary circuit powered by a second power supply, the secondary circuit including:

a control signal output for supplying a control signal to the clock circuit; and a clock data output for outputting new clock data to the clock circuit;

the clock circuit including.

clock generation means for generating current clock data and outputting it to the secondary circuit;

detection means for monitoring voltage from the second power supply and generating a system reset signal for supply to the secondary circuit in the e-vent the voltage falls below a predetermined level;

a first latch having a reset operable by a predetermined state of the system reset output generated by the detection means;

a comparator accepting as inputs the control signal from the secondary circuit and an output of the first latch; and a multiplexor accepting as data inputs the clock data from the secondary circuit and the clock data from the clock circuit, and accepting as a control input the output of the comparator;

the integrated circuitry being configured such that:

when the secondary circuit is not asserted and the control signal is asserted, the current clock data in the clock circuit is replaced with the new clock data; and when the first latch is reset, the comparator and multiplexor prevent current clock data from being replaced by data from the secondary circuit.

In a preferred form, the first latch is a D-type latch accepting as an input a logical high. More preferably, the input of the D-type latch is tied to the first power supply.

Preferably, the output of the multiplexor is latched by a second latch.

BRIEF DESCRIPTION OF DRAWINGS

A preferred embodiment of the invention will now be described, by way of example only, with reference to the accompanying drawing, which is a block diagram of an integrated circuit according to the invention.

DETAILED DESCRIPTION OF PREFERRED EMBODIMENT

It will be appreciated by those skilled in the art that the clock data generated and maintained in the clock circuit is real time clock data, and not system clock data. Data within the circuitry will be moved and processed based on the rise and fall of system clock signals, as is well know to those skilled in the art of digital electronics. However, to help reduce confusion by discussing multiple types of clock data and signals, it is to be understood that "clock data" and similar language is intended to refer to real time clock data within this detailed description, unless a contrary intention is clearly shown by the context.

Referring to the drawing, the preferred embodiment is applied to an integrated circuit 20 including a clock circuit 22 powered by a first power supply 24 and a secondary circuit 26 powered by a second power supply 28.

In the preferred form the secondary circuit 26 includes a CPU 30 and also includes memory, data buses, control signals and any other required circuitry elements (not shown). The secondary circuit 26 includes a control signal output 32 for supplying a control signal to the clock circuit 22 and a clock data output 34 for outputting new (real time) clock data to the clock circuit 22.

The clock circuit 22 includes clock generation means 38 for generating current clock data and outputting it to the secondary circuit 26. The clock circuit 22 also includes a voltage detector 39 connected to the second power supply 28, for monitoring the voltage thereof. The voltage detector 39 is configured to output a "system reset" signal to the secondary circuit 26 in the event that the voltage falls below a predetermined value. The voltage detector also outputs a "not system reset" signal.

A first latch 40 within the clock circuit 22 includes a reset input 42 that accepts the "not system reset" signal from the voltage detector 39. The first latch 40 has a data input that receives a logical high and is preferably tied to the first power supply as shown. A comparator in the form of an AND gate 44 within the clock circuit 22 accepts as inputs the control signal from the secondary circuit 26 and an output of the first latch 40

The clock circuit 22 also includes a second latch 48 that accepts as input the output of a multiplexor 46. The output of the second latch 48 is supplied to the remaining circuitry in the clock circuit and also fed back as an input to the multiplexor 46 The multiplexor also accepts data from the clock data output 34 as a data input. The output of the AND gate 44 is connected to the control input of the multiplexor 46 to control which of the multiplexor's inputs is supplied to its output.

In use, during normal operation, both the clock circuit 22 and the secondary circuitry 26 are powered by their respective power supplies. The clock circuit 22 maintains real time clock data, such as the time and date in the camera example. If a user wishes to amend the time and or date, this is done via external control buttons or the like (not shown). The user input is interpreted by the CPU 30, and used to generate appropriate signals to amend the current clock data within the clock circuit. In the present case, those signals include the signal output at clock data output 34, and the control signal from the control signal output. When the control signal is asserted, the new clock data is clocked into the second latch 48 in the next system clock cycle.

In the event the secondary circuit is powered down (for example, if the battery fails or the voltage drops), this is detected by the voltage detector 39, which sets the "system reset" output to logic high, thereby resetting the secondary circuit 26. Correspondingly, the "not system reset" signal goes low, which upon supply to the inverting input of the first latch, causes the first latch to be reset. This results in the output of the first latch being driven to a logic zero. This drives the corresponding input to the AND gate 44 to a logic zero, meaning that, irrespective of any spurious signals from the secondary circuit as it powers down, the clock data within the clock circuit will not be amended.

The circuit has the advantage that, during testing, the not main system reset is effectively buffered from the input to the comparator (in the form of AND gate 44). It can therefore be tested in parallel with the rest of the circuitry using normal scan methods known to those skilled in the art.

Although the invention has been described in relation to a particular embodiment, it will be appreciated by those skilled in the art that the invention can be embodied in many other forms. For example, it will be understood by those skilled in the art that different types of latches, comparators and other components can be used without departing from the spirit of the invention.

What is claimed is:

1. Integrated circuitry including a clock circuit powered by a first power supply and a secondary circuit powered by a second power supply, the secondary circuit including:
    a control signal output for supplying a control signal to the clock circuit; and
    a clock data output for outputting new real time clock data to the clock circuit;
    the clock circuit including:
        clock generation means for generating current real time clock data and outputting it to the secondary circuit;
        detection means for monitoring voltage from the second power supply and generating a system reset signal for supply to the secondary circuit in the event the voltage falls below a predetermined level;
        a first latch having a reset operable by a predetermined state of the system reset output generated by the detection means;
        a comparator accepting as inputs the control signal from the secondary circuit and an output of the first latch; and
        a multiplexor accepting as data inputs the new real time clock data from the secondary circuit and a clock data signal from the clock circuit, and accepting as a control input the output of the comparator;
    the integrated circuitry being configured such that:
        when the system reset signal is not asserted and the control signal is asserted, the current real time clock data in the clock circuit is replaced with the new real time clock data; and
        when the first latch is reset, the comparator and multiplexor prevent current real time clock data from being replaced by the new real time clock data from the secondary circuit.

2. Circuitry according to claim 1, wherein the first latch is a D-type latch accepting as an input a logical high.

3. Circuitry according to claim 2, wherein the input of the D-type latch is tied to the first power supply.

4. Circuitry according to claim 1, wherein the output of the multiplexor is latched by a second latch.

5. A clock circuit for use with a system having a first power supply and a second power supply, the clock circuit being powered by the first power supply and the system being powered by the second power supply, the system having a clock data input to receive current real time clock data, a clock data output that provides new real time clock data to the clock circuit, and a control output that provides a control signal to the clock circuit permitting the new real time clock data to be written to the clock circuit, the clock circuit comprising:
    a clock generator having an input to receive the new real time clock data and an output to provide the current real time clock data to the system;
    a voltage detector having an input to receive a voltage of the second power supply and first and second outputs to provide first and second reset signals, respectively, when the voltage of the second power supply is below a predetermined level, the first reset signal being provided to the system;

a latch having a reset input to receive the second reset signal and an output to provide an output signal that identifies when the voltage of the second power supply is below the predetermined level;

a comparator having a first input to receive the control signal from the system, a second input to receive the output signal of the latch, and an output to provide a clock circuit control signal that is asserted only when the control signal is asserted and the voltage of the second power supply is not below the predetermined level; and a multiplexor having a first input to receive the new real time clock data from the system, a second input to receive an internal signal of the clock circuit, a control input to receive the clock circuit control signal from the comparator, and an output to provide one of the new real time clock data and the internal signal to the input of the clock generator.

6. The clock circuit of claim 5, wherein the clock circuit is configured to replace the current real time clock data with the new real time clock data only when the first reset signal is not asserted and the control signal is asserted.

7. The clock circuit of claim 6, wherein the latch is a first latch, the clock circuit further comprising a second latch having a data input connected to the output of the multiplexor and an output connected to the input of the clock generator.

8. The clock circuit of claim 7, wherein the output of the second latch is connected to the second input of the multiplexor.

9. The clock circuit of claim 5, wherein the latch is a D-type latch having a data input that is connected to a logical high.

10. The clock circuit of claim 9, wherein the data input of the D-type latch is connected to a power supply output of the first power supply.

11. A method of operating a first and second circuit having respective first and second power supplies, the method comprising acts of:

A) generating a real time clock signal in the first circuit;
B) receiving a new real time clock data from the second circuit;
C) determining whether a power supply voltage of the second power supply is below a predetermined threshold;
D) receiving a control signal indicative of a transmission of the new real time clock data;
E) selecting the new real time clock data only when it is determined in act C) that the power supply voltage of the second power supply is not below the predetermined threshold and the control signal received in act D) indicates the transmission of the new real time clock data; and
F) adjusting the real time clock signal with the new real time clock data based on the selection in act E).

12. The method of claim 11, wherein the act C) performed in the first circuit.

13. The method of claim 11, wherein the act E) includes an act of preventing selection of the new real time clock data when it is determined that the power supply voltage of the second power supply is below the predetermined threshold.

14. The method of claim 11, wherein the act E) includes an act of preventing selection of the new real time clock data when it is determined that the power supply voltage of the second power supply is below the predetermined threshold and irrespective of whether the control signal received in act D) indicates the transmission of new real-time clock data.

15. The method of claim 11, further comprising an act of:

G) simultaneously testing the first circuit and the second circuit to ensure proper operation of the first and second circuits.

16. The method of claim 15, wherein the act G) further comprises an act of testing the operation of the first circuit while the power supply voltage of the second power supply is below the predetermined threshold.

* * * * *

UNITED STATES PATENT AND TRADEMARK OFFICE
CERTIFICATE OF CORRECTION

PATENT NO.    : 6,690,152 B2
DATED         : February 10, 2004
INVENTOR(S)   : David Smith It is certified that error appears in the above-identified patent and that said Letters Patent is hereby corrected as shown below:

<u>Title page,</u>
Item [57], ABSTRACT, should read as follows:
-- Integrated circuitry including a clock circuit powered by a first power supply and a secondary circuit powered by a second power supply. The secondary circuit includes a control signal output for supplying a control signal to the clock circuit and a clock data output for outputting new clock data to the clock circuit. The clock circuit includes: clock generator for generating current clock data and outputting it to the secondary circuit; detector for monitoring voltage from the second power supply and generating a system reset signal for supply to the secondary circuit in the event the voltage falls below a predetermined level; a first latch having a reset operable by a predetermined state of the system reset output generated by the detector; a comparator accepting as inputs the control signal from the secondary circuit and an output of the first latch; and a multiplexor accepting as date inputs the clock data from the secondary circuit and the clock data from the clock circuit, and accepting as a control input the output of the comparator. The integrated circuitry is configured such that when the secondary circuit is not asserted and the control signal is asserted, the current clock data in the clock circuit is replaced with the new clock data. Moreover, when the first latch is reset, the comparator and multiplexor prevent current clock data from being replaced by data from the secondary circuit. --

Signed and Sealed this

Twentieth Day of April, 2004

JON W. DUDAS
*Acting Director of the United States Patent and Trademark Office*